United States Patent
Singh et al.

(10) Patent No.: US 11,475,180 B2
(45) Date of Patent: Oct. 18, 2022

(54) SYSTEM AND METHOD FOR DETERMINATION OF AIR ENTRAPMENT IN LADLES

(71) Applicant: Tata Consultancy Services Limited, Mumbai (IN)

(72) Inventors: Umesh Singh, Pune (IN); Amarendra Kumar Singh, Kanpur (IN)

(73) Assignee: Tata Consultancy Services Limited, Mumbai (IN)

(*) Notice: Subject to any disclaimer, the term of this patent is extended or adjusted under 35 U.S.C. 154(b) by 926 days.

(21) Appl. No.: 16/269,052

(22) Filed: Feb. 6, 2019

(65) Prior Publication Data
US 2019/0278879 A1    Sep. 12, 2019

(30) Foreign Application Priority Data

Mar. 9, 2018   (IN) .............................. 201821008855

(51) Int. Cl.
*G06F 30/20* (2020.01)
*G06N 20/00* (2019.01)
(Continued)

(52) U.S. Cl.
CPC .............. *G06F 30/20* (2020.01); *B22D 11/16* (2013.01); *G06F 30/23* (2020.01); *G06N 3/084* (2013.01);
(Continued)

(58) Field of Classification Search
CPC ......... G06F 30/20; G06F 30/23; G06N 20/00; G06N 3/084; G06N 3/0481; G06N 3/10; B22D 11/16
See application file for complete search history.

(56) References Cited

U.S. PATENT DOCUMENTS 4,957,542 A * 9/1990 Barthelemy .............. C22B 9/05
                                                              75/10.39
2007/0180955 A1   8/2007 Warner
(Continued)

FOREIGN PATENT DOCUMENTS

CN    101846971    9/2010
CN    102419581    4/2012
(Continued)

OTHER PUBLICATIONS

Q. Cao et al: "Mathematical Investigation of Fluid Flow, Mass Transfer, and Slag-Steel Interfacial Behavior in Gas-stirred Ladles", Metallurgical and Materials Transactions B, vol. 49, No. 3, pp. 1388-1404 (2018), XP036493602 (Year: 2018).*
(Continued)

*Primary Examiner* — Jianchun Qin
(74) *Attorney, Agent, or Firm* — Finnegan, Henderson, Farabow, Garrett & Dunner, LLP

(57) ABSTRACT

This disclosure relates generally to SYSTEM AND METHOD FOR DETERMINATION OF AIR ENTRAPMENT IN LADLES performing various refining operations at a secondary steel making stage of a ladle is challenging as it requires huge time and resources. The present subject matter discloses a technique for determination of air entrapment in a ladle. In an embodiment, method uses transient computational fluid dynamics modeling for simulating tapping process of liquid steel and tracking the interface with respect to time. By carrying out the parametric study for different geometrical and operational parameters, training and validation data is generated which is then used for training an artificial neural network model. The new ladle geometrical and operational input parameters for which output parameters are required are then used to predict the air entrapment.

12 Claims, 11 Drawing Sheets

(51) Int. Cl.
  *B22D 11/16* (2006.01)
  *G06N 3/08* (2006.01)
  *G06F 30/23* (2020.01)
  *G06N 3/04* (2006.01)
  *G06N 3/10* (2006.01)
(52) U.S. Cl.
  CPC ........... *G06N 20/00* (2019.01); *G06N 3/0481* (2013.01); *G06N 3/10* (2013.01)

(56) References Cited

U.S. PATENT DOCUMENTS

2014/0207424 A1* 7/2014 Singh .................. G06F 30/13
  703/1
2018/0081339 A1* 3/2018 Zhu .................. G05B 13/048

FOREIGN PATENT DOCUMENTS

| EP | 2664970 | 11/2013 |
| JP | 5328305 | 5/2010 |
| KR | 101385328 | 11/2012 |

OTHER PUBLICATIONS

A. Kamaraj et al: "Estimation and Analysis of Excess Oxygen Input into Ladle During Liquid Steel Tapping", Transactions of the Indian Institute of Metals, vol. 70, No. 9 (2017), pp. 2465-2476, XP036320461 (Year: 2017).*

* cited by examiner

SYSTEM AND METHOD FOR DETERMINATION OF AIR ENTRAPMENT IN LADLES

PRIORITY CLAIM

This U.S. patent application claims priority under 35 U.S.C. § 119 to: India Application No. 201821008855, filed on Mar. 9 2018. The entire contents of the aforementioned application are incorporated herein by reference.

TECHNICAL FIELD

This disclosure relates generally to ladle refining process, and more particularly to system and method for determination of air entrapment in a ladle.

BACKGROUND

Various refining operations at a secondary steel making stage are done in a ladle furnace. During the refining operation, nitrogen, hydrogen and oxygen pickup from a tapping operation in the ladle depends on entrapment of air bubble while tapping. An existing method calculates nitrogen, hydrogen and oxygen pickup from air entrapment while tapping by gross empirical correlations. These empirical relations may not capture these phenomena as they are either based on water model experiments. Another existing method uses a high temperature simulation model for estimation of air entrapment. However, these simulation model may require huge time and resources.

SUMMARY

The following presents a simplified summary of some embodiments of the disclosure in order to provide a basic understanding of the embodiments. This summary is not an extensive overview of the embodiments. It is not intended to identify key/critical elements of the embodiments or to delineate the scope of the embodiments. Its sole purpose is to present some embodiments in a simplified form as a prelude to the more detailed description that is presented below.

In view of the foregoing, an embodiment herein provides methods and systems for determination of air entrapment in ladles. In one aspect, a processor-implemented method includes steps of: obtaining geometrical parameters associated with a ladle, wherein the geometrical parameters comprise ladle top and bottom diameters, ladle height, a number of plugs, position of the plugs, and diameters of the plugs; capturing ladle process parameters for tapping, wherein the ladle process parameters comprise a range of tapping rates, a tapping inlet area, an initial slag height, a percentage of carry over slag in the incoming steel and a duration of tapping; creating input data using the ladle process parameters and geometrical parameters; performing multi-phase computational fluid dynamics using the created input data to obtain the simulation results; calculating output data which is an air-steel interface area and an amount of air entrapment from the simulated results; creating training data from the input data and corresponding output data; training an artificial neural network (ANN) model using the obtained training data; and determining an amount of air entrapment and an air-steel interface area in the ladle for new geometrical parameters and the ladle process parameters using the trained ANN model.

In another aspect, a system for determination of air entrapment in ladles is provided. The system includes one or more memories; and one or more hardware processors, the one or more memories coupled to the one or more hardware processors wherein the one or more hardware processors are configured to execute programmed instructions stored in the one or more memories to: obtain geometrical parameters associated with a ladle, wherein the geometrical parameters comprise ladle top and bottom diameters, ladle height, a number of plugs, position of the plugs, and diameters of the plugs; capture ladle process parameters for tapping, wherein the ladle process parameters comprise a range of tapping rates, a tapping inlet area, an initial slag height, a percentage of carry over slag in the incoming steel and a duration of tapping; create input data using the ladle process parameters and geometrical parameters; perform multi-phase computational fluid dynamics using the created input data to obtain the simulation results; calculate output data which is an air-steel interface area and an amount of air entrapment from the simulated results; create training data from the input data and corresponding output data; train an artificial neural network (ANN) model using the obtained training data; and determine an amount of air entrapment and an air-steel interface area in the ladle for new geometrical parameters and the ladle process parameters using the trained artificial neural network.

In yet another aspect, a non-transitory computer-readable medium having embodied thereon a computer program for executing a method for determination if air entrapment in ladles is provided. The method includes the steps of: obtaining geometrical parameters associated with a ladle, wherein the geometrical parameters comprise ladle top and bottom diameters, ladle height, a number of plugs, position of the plugs, and diameters of the plugs; capturing ladle process parameters for tapping, wherein the ladle process parameters comprise a range of tapping rates, a tapping inlet area, an initial slag height, a percentage of carry over slag in the incoming steel and a duration of tapping; creating input data using the ladle process parameters and geometrical parameters; performing multi-phase computational fluid dynamics using the created input data to obtain the simulation results; calculating output data which is an air-steel interface area and an amount of air entrapment from the simulated results; creating training data from the input data and corresponding output data; training an artificial neural network (ANN) model using the obtained training data; and determining an amount of air entrapment and an air-steel interface area in the ladle for new geometrical parameters and the ladle process parameters using the trained ANN model.

It should be appreciated by those skilled in the art that any block diagram herein represents conceptual views of illustrative systems embodying the principles of the present subject matter. Similarly, it is appreciated that any flow charts, flow diagrams, state transition diagrams, pseudo code, and the like represent various processes which may be substantially represented in computer readable medium and so executed by a computing device or processor, whether or not such computing device or processor is explicitly shown.

BRIEF DESCRIPTION OF THE DRAWINGS

The detailed description is described with reference to the accompanying figures. In the figures, the left-most digit(s) of a reference number identifies the figure in which the reference number first appears. The same numbers are used throughout the drawings to reference like features and modules.

Figure 1:
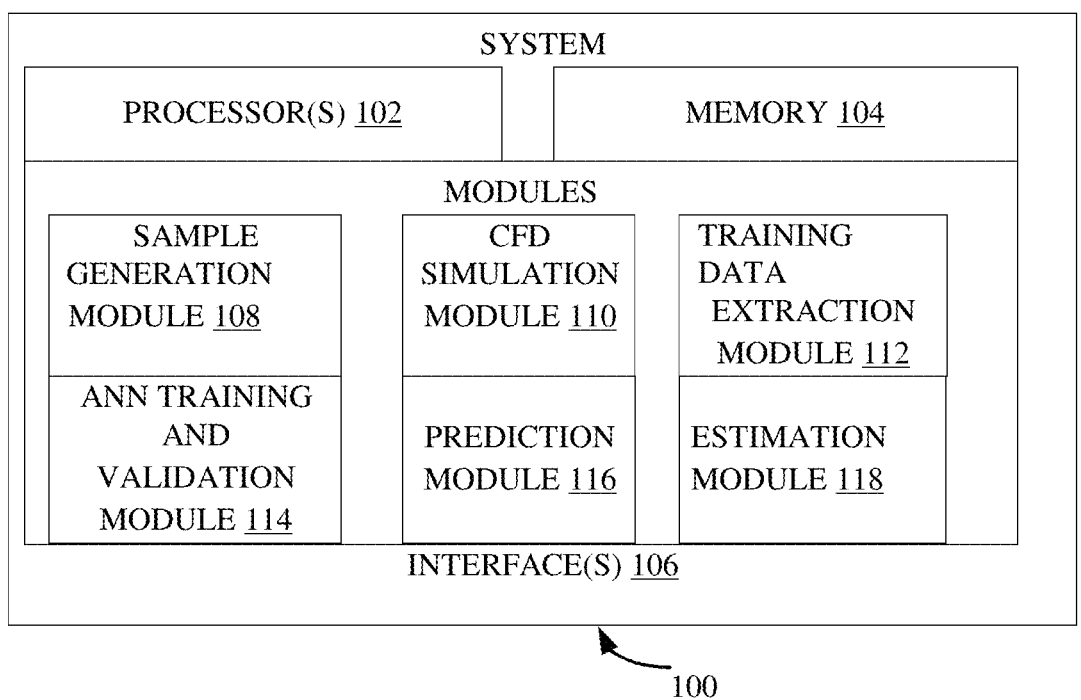
FIG. 1 illustrates a block diagram of a system for determination of air entrapment in ladles, in accordance with an example embodiment.
Figure 2:
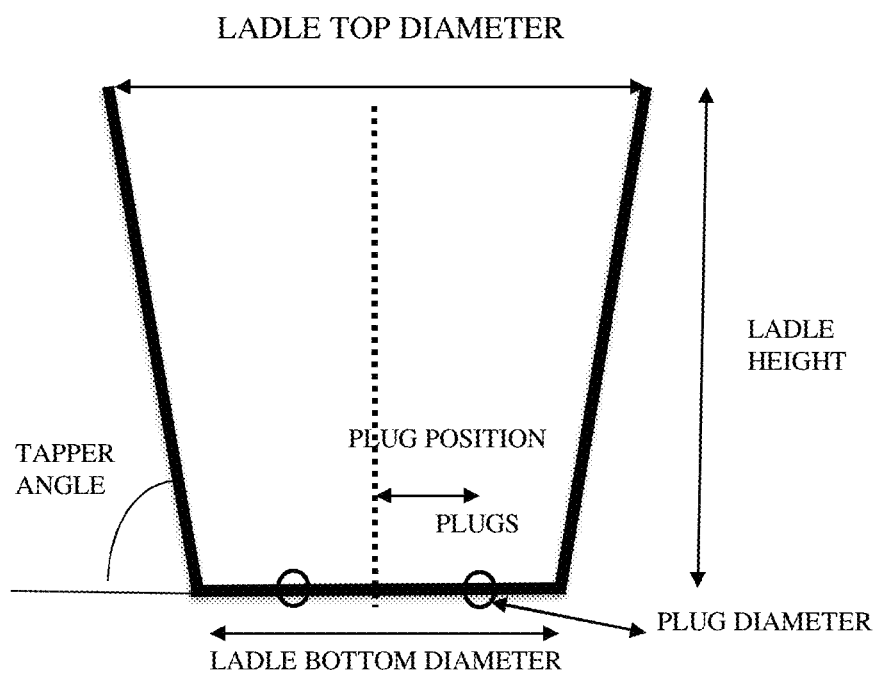
FIG. 2 illustrates a schematic of ladle geometry, in accordance with an example embodiment.

It should be appreciated by those skilled in the art that any block diagrams herein represent conceptual views of illustrative systems and devices embodying the principles of the present subject matter. Similarly, it will be appreciated that any flow charts, flow diagrams, and the like represent various processes which may be substantially represented in computer readable medium and so executed by a computer or processor, whether or not such computer or processor is explicitly shown.

DETAILED DESCRIPTION

The embodiments herein and the various features and advantageous details thereof are explained more fully with reference to the non-limiting embodiments that are illustrated in the accompanying drawings and detailed in the following description. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

A technique for determination of air entrapment in a ladle is disclosed. This bridges the gap of requirement of quickly and accurately determining the air entrapment while tapping of liquid steel in the ladle. Since finding these parameters from computational fluid dynamics (CFD) modeling is very time and resource intensive. In an embodiment, the technique utilizes eye opening data generated from the CFD to build an artificial neural network (ANN) model for purging operation of ladle to quickly predict the eye opening which is then utilized for prediction of nitrogen, oxygen and hydrogen pickup from eye opening. For example, CFD modeling is used to generate training data which is used for training the neural network model and then trained model is used for estimating the output variables. The setup for the neural network is estimated by running the neural network with the different number of hidden layers and nodes to train the neural network model. The new ladle geometrical and operational input parameters for which the output parameters are required are then used to predict the air entrapment. Using the predicted air entrapment, nitrogen, hydrogen and oxygen pickup is estimated.

The methods and systems are not limited to the specific embodiments described herein. In addition, the method and system can be practiced independently and separately from other modules and methods described herein. Each device element/module and method can be used in combination with other elements/modules and other methods.

The manner, in which the system and method for determination of air entrapment in ladles, has been explained in details with respect to the FIGS. 1 through 6. While aspects of described methods and systems for determination of air entrapment in ladles can be implemented in any number of different systems, utility environments, and/or configurations, the embodiments are described in the context of the following exemplary system(s).

FIG. 1 illustrates a block diagram of a system 100 for determination of air entrapment in ladles, in accordance with an example embodiment. In an example embodiment, the system 100 may be embodied in, or is in direct communication with a computing device. The system 100 includes or is otherwise in communication with one or more hardware processors such as processor(s) 102, one or more memories such as a memory 104, and a network interface unit such as a network interface unit 106. In an embodiment, the processor 102, memory 104, and the network interface unit 106 may be coupled by a system bus such as a system bus or a similar mechanism. Although FIG. 1 shows example components of the system 100, in other implementations, the system 100 may contain fewer components, additional components, different components, or differently arranged components than depicted in FIG. 1.

The processor 102 may include circuitry implementing, among others, audio and logic functions associated with the communication. For example, the processor 102 may include, but are not limited to, one or more digital signal processors (DSPs), one or more microprocessor, one or more special-purpose computer chips, one or more field-programmable gate arrays (FPGAs), one or more application-specific integrated circuits (ASICs), one or more computer(s), various analog to digital converters, digital to analog converters, and/or other support circuits. The processor 102 thus may also include the functionality to encode messages and/or data or information. The processor 102 may include, among other things, a clock, an arithmetic logic unit (ALU) and logic gates configured to support operation of the processor 102. Further, the processor 102 may include functionality to execute one or more software programs, which may be stored in the memory 104 or otherwise accessible to the processor 102.

The functions of the various elements shown in the figure, including any functional blocks labeled as "processor(s)", may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" should not be construed to refer exclusively to hardware capable of executing software, and may implicitly include, without limitation DSP hardware, network processor, application specific integrated circuit (ASIC), FPGA, read only memory (ROM) for storing software, random access memory (RAM), and non-volatile storage. Other hardware, conventional, and/or custom, may also be included.

The interface(s) 106 may include a variety of software and hardware interfaces, for example, interfaces for peripheral device(s), such as a keyboard, a mouse, an external memory, and a printer. The interface(s) 106 can facilitate multiple communications within a wide variety of networks and protocol types, including wired networks, for example, local area network (LAN), cable, etc., and wireless networks, such as Wireless LAN (WLAN), cellular, or satellite.

The one or more memories such as a memory 104, may store any number of pieces of information, and data, used by the system to implement the functions of the system.

The memory 104 may include for example, volatile memory and/or non-volatile memory. Examples of volatile memory may include, but are not limited to volatile random access memory. The non-volatile memory may additionally or alternatively comprise an electrically erasable programmable read only memory (EEPROM), flash memory, hard drive, or the like. Some examples of the volatile memory includes, but are not limited to, random access memory, dynamic random access memory, static random access memory, and the like. Some example of the non-volatile memory includes, but are not limited to, hard disks, magnetic tapes, optical disks, programmable read only memory, erasable programmable read only memory, electrically erasable programmable read only memory, flash memory, and the like. The memory 104 may be configured to store information, data, applications, instructions or the like for enabling the system 100 to carry out various functions in accordance with various example embodiments. Additionally or alternatively, the memory 104 may be configured to store instructions which when executed by the processor 102 causes the system to behave in a manner as described in various embodiments. The memory 104 includes a sample generation module 108, a CFD simulation module 110, a training data extraction module 112, an ANN training and validation module 114, a prediction module 116, an estimation module 118 and other modules. The modules 108 to 118 and other modules include routines, programs, objects, components, data structures, etc., which perform particular tasks or implement particular abstract data types. The other modules may include programs or coded instructions that supplement applications and functions of the system 100.

Figure 3:
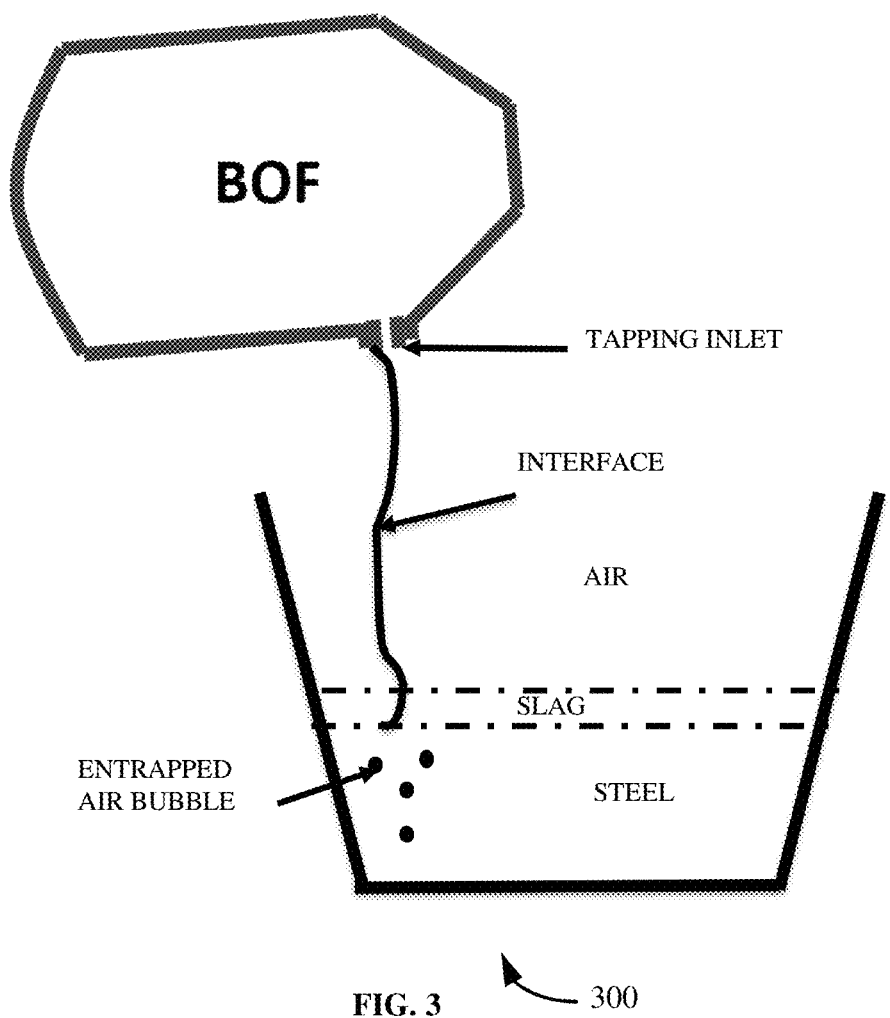
FIG. 3 illustrates a schematic of tapping operation, in accordance with an example embodiment.
Figure 4A:
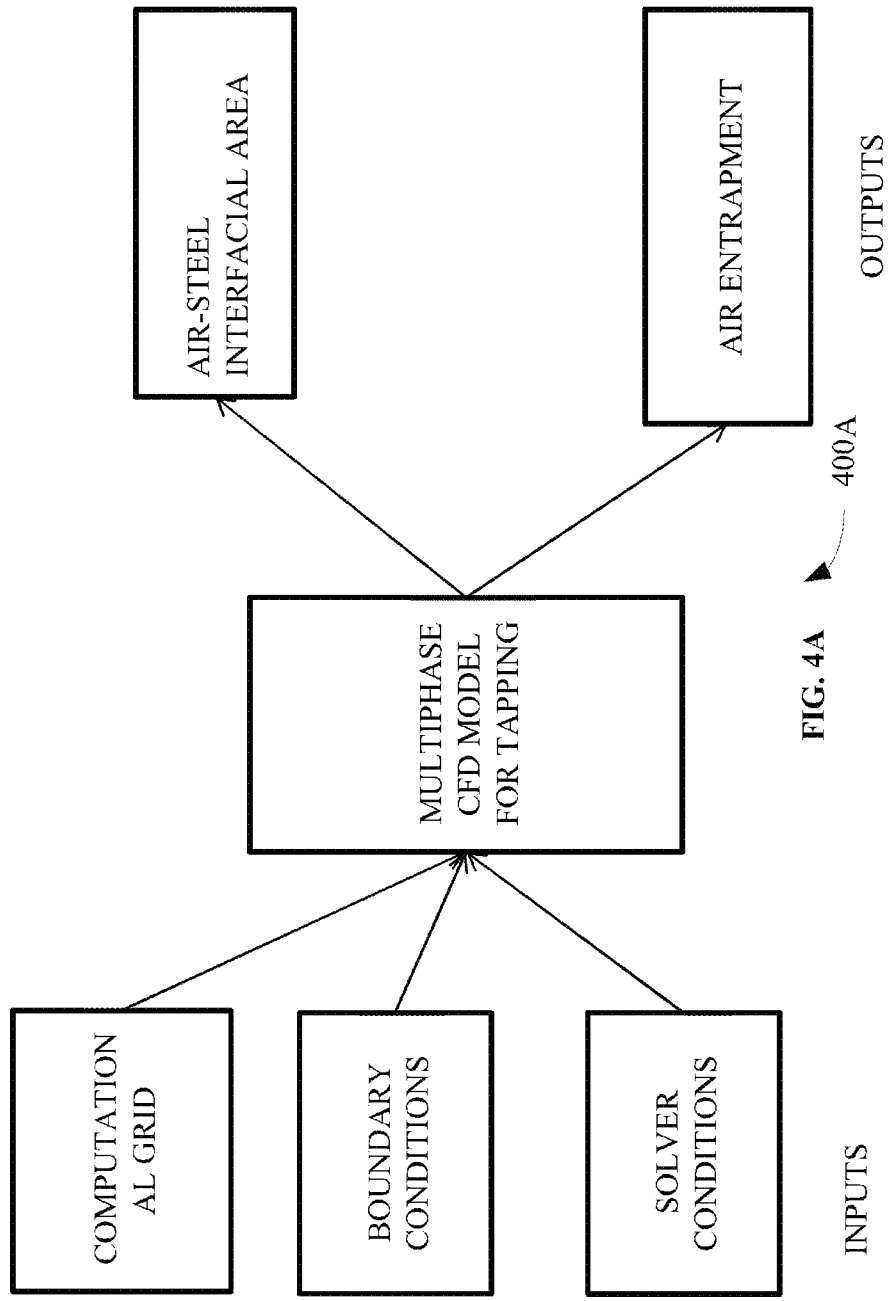
FIG. 4A illustrates details of a computational fluid dynamics (CFD) model for tapping, in accordance with an example embodiment.
Figure 4B:
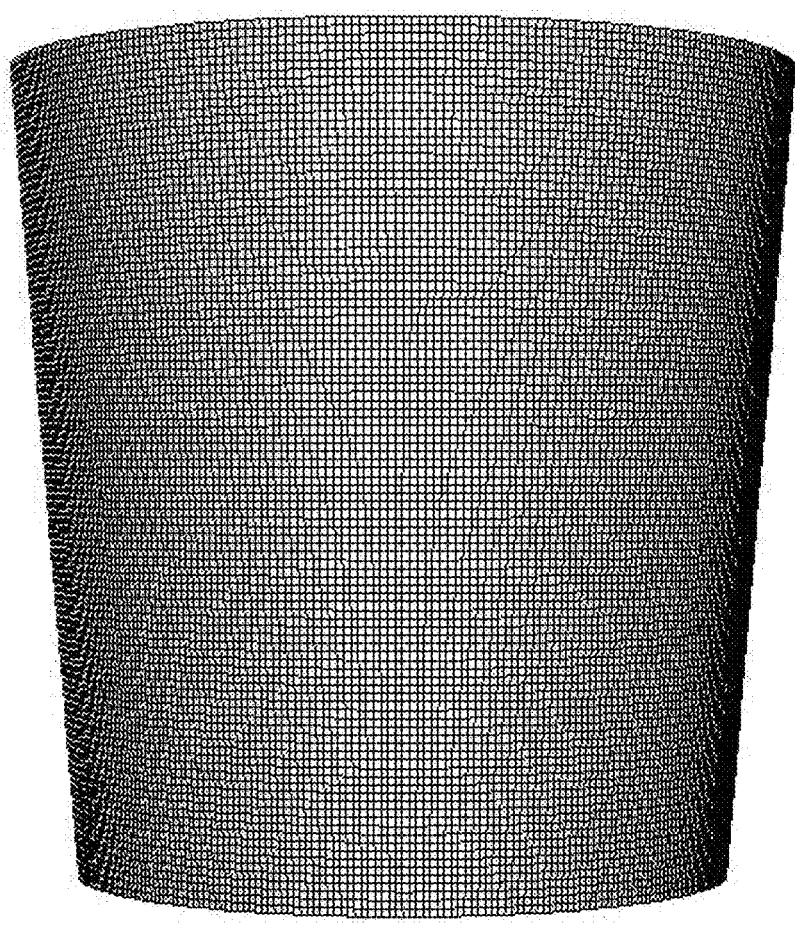
FIG. 4B illustrates a computational grid of a ladle, in accordance with an example embodiment.
Figure 5:
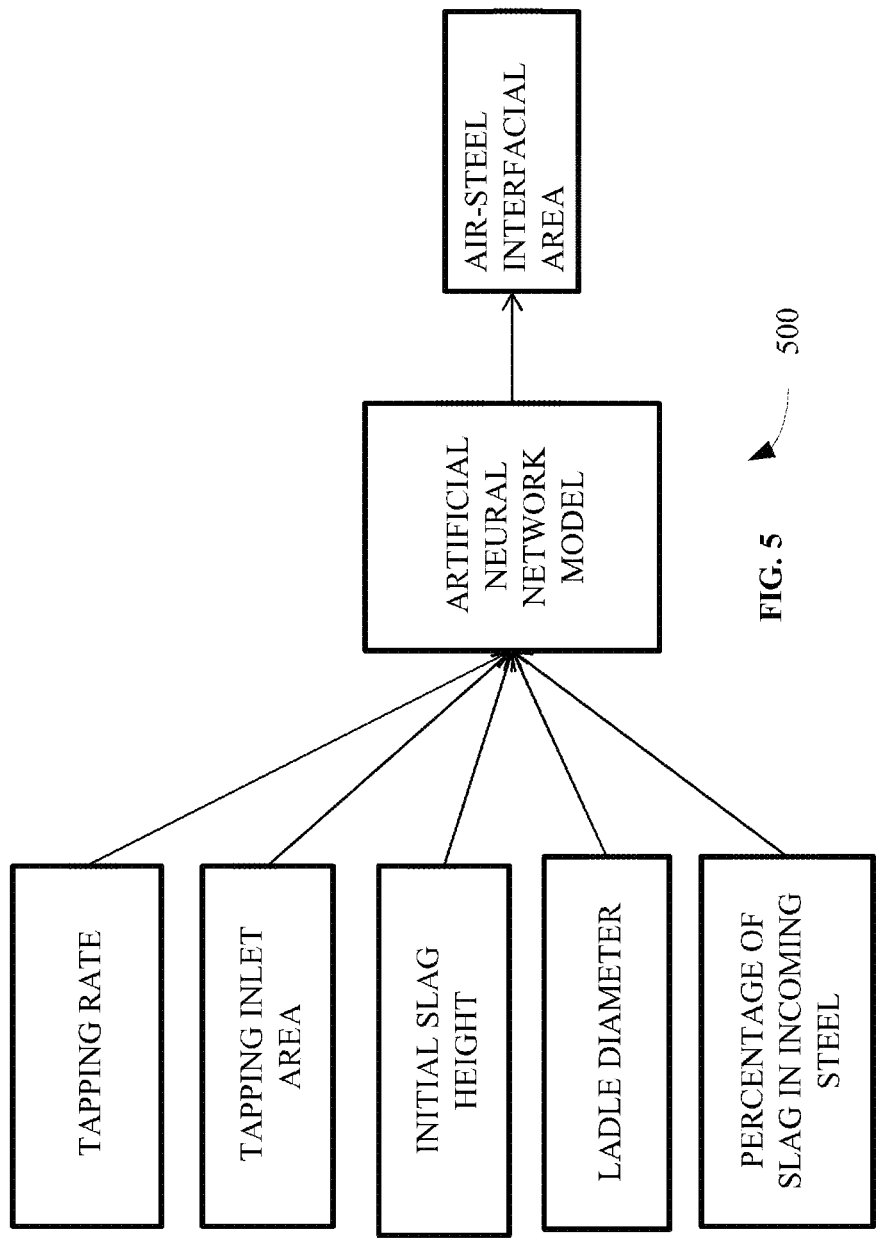
FIG. 5 illustrates details of an artificial neural network for air entrapment estimation, in accordance with an example embodiment.

In operation, the sample generation module 108 receives different set of ladle geometrical parameters and process parameters to get sample data needed to generate training data from CFD simulations. The sample is generated in such a way that to cover the whole range of geometrical and process parameters. In an example implementations, the sample generation module 108 receives geometrical parameters of the ladle and their range of each of the geometrical dimensions used in industries. For example, the geometrical parameters includes ladle top and bottom diameters, ladle height, plug position, plug diameters, number of plugs, tapper angle and so on (as shown in a schematic 200 of FIG. 2). In this implementation, the sample generation module 108 receives process parameters for tapping including a range of tapping rates, a tapping inlet area, an initial slag height (or weight), a percentage of carry over slag in the incoming steel and duration of tapping. For example, a schematic 300 of FIG. 3 illustrates tapping operation.

After receiving the geometrical and process parameters, the sample generation module 108 creates a sample input data using Taguchi design of experiment techniques (DOE) for different process parameters and geometrical parameters. In an embodiment, the sample generation module 108 divides each set of input parameter in the number of sets which can captures the whole range of processing conditions and geometrical details. For example, first the maximum and minimum range of the variable are taken then, for example, Taguchi method of DOE is used to generate the experimental data sets. The key input parameters are identified based on its effects on output. For example, the key parameters in each of the sets are identified by calculating an influence index from the CFD simulation results for each of the extreme ranges of parameters and one or more parameters with influence index greater than a predefined value are selected. Furthermore, the input data for the one or more parameters is created. For identification of the key input parameters, the extreme range variable are used to do the CFD simulation and the influence index is calculated. The key parameters are selected which has higher influence index. The influence index is defined as the difference between the output values for extreme inputs of a parameter. Example for influence index compared to Base case (1 ton/s rate and 1-meter inlet diameter) is shown in the graph 700C of FIG. 7C.

Further, the CFD simulation module 110 uses the different set of input parameters to convert into ladle computational grid and boundary conditions and then simulates the fluid flow condition present in the tapping operations to get the converged numerical results. Furthermore, training data extraction module 112 extracts output parameters like air-steel interfacial area and air entrapment for the set of input from the CFD simulation results. In an example embodiment, the CFD simulation module 110 performs simulations on all the generated sample input data for the variables which has high influence index. Then, the CFD simulation module calculates output data (i.e., air entrapment and an air-steel interfacial area) based on the simulation results. For example, the air entrapment within the steel in the ladle is calculated by estimating the fluid area where the liquid steel is less than a predetermined value (e.g., 10%). The air-steel interfacial area is estimated by estimating the liquid steel-air interfacial area where the percentage of air is more than a predetermined value. For example, air volume fraction is more than 90%.

In an example embodiment, a CFD model for tapping (as shown in a CFD model 400A of FIG. 4A) as shown in is used to carry out the simulation study to capture physical phenomena among different phases. The model uses a computational grid file generated after crating a virtual geometry of the ladle (as shown in a CFD grid 400B of FIG. 4B). Then, process variables are used to generate boundary condition needed in the CFD modeling. For example, the boundary conditions include smooth wall boundary conditions at all the walls, mass flow inlet at the ladle inlet, pressure outlet boundary at top wall, initialization with initial level of slag, steel and air, isothermal condition at 1873K. The model uses volume of fluid (VOF) based method to solve the fluid flow inside the ladle using fluid interaction parameters like surface tension between air-steel and slag-steel, air-slag, air-steel. The empty volume of the ladle is filled with air for each time step of the calculation. The initial height of fluid is taken from the initial slag layer height. Convergence criteria of $10^{-4}$ is used for getting the converged results. There are some solver condition to be used in the CFD modeling. The solution of the CFD model gives the information about the output parameters like steel-air interfacial area and air entrapment. For example, the model computes continuity using the below equation:

$$\frac{\partial \rho}{\partial t} + \nabla \cdot (\rho \vec{V}) = 0$$

Further, the CFD model computes momentum conservation using the below equation:

$$\frac{\partial \rho \vec{v}}{\partial t} + \nabla \cdot (\rho \vec{v} \vec{v}) = -\nabla p + \nabla \cdot [\mu_\epsilon (\nabla \vec{v} + \nabla \vec{v})] + \rho g$$

Furthermore, the K-epsilon turbulence model equations include:

$$\frac{\partial \rho \kappa}{\partial t} + \frac{\partial (\rho \kappa u_i)}{\partial x_i} = \frac{\partial}{\partial x_i}\left[\left(\mu + \frac{\mu_t}{\sigma_x}\right)\frac{\partial \kappa}{\partial x_i}\right] + G_\kappa - \rho \epsilon$$

$$\frac{\partial \rho \epsilon}{\partial t} + \frac{\partial (\rho \epsilon u_i)}{\partial x_i} = \frac{\partial}{\partial x_i}\left[\left(\mu + \frac{\mu_t}{\sigma_\epsilon}\right)\frac{\partial \epsilon}{\partial x_i}\right] + C_{1\epsilon}\frac{\epsilon}{\kappa}(G_\kappa + C_{3\epsilon}G_b) - C_{2\epsilon\rho}\left(\frac{\epsilon^2}{\kappa}\right)$$

Also, the VOF model equations include (here q=l, s, air corresponds to liquid steel, slag and air respectively):

$$\frac{\partial \alpha_q}{\partial t} + (v \cdot \nabla)\alpha_q = 0$$

$$\alpha_l + \alpha_s + \alpha_{air} = 1$$

$\rho = \rho_{air} + \rho_s + \rho_l$ In addition, the ANN training and validation module 114 uses the generated data from CFD model to train the network. Once the training is done, then few set of input output data is used for validating the ANN model so as to check its correctness. In this case, the predicted results from the trained ANN model are compared with the actual CFD results. When all the predicted results lies within ±5% then only the ANN model is considered as trained. In an embodiment, the training of the ANN model starts with the 2 hidden layers, 5 input layers and one output layers. For example, Backpropagation algorithm is used while training the network and the number of hidden layers are varied. Each hidden layers starts with the minimum 3 nodes and sequentially increases/decreases based on the validation results. Whenever the validation targets are achieved or near the targets i.e., predicted results lies within ±5% of CFD results then the network architecture is stored. In this way, different network architecture is stored for different number of hidden layers and then compared. The network which predicts in the highest accurate way is selected as the trained ANN model. Then, the prediction module 116 predicts output parameters like steel-air interfacial area and air entrapment in case of tapping for a new set of input data.

In an ANN model for prediction of air entrapment (as shown in an ANN model 500 of FIG. 5), input variables include tapping rate, tapping inlet area, initial slag height, ladle diameter, a percentage of slag in incoming steel, and initial slag layer thickness. In each hidden layers of the model, there are multiple nodes which are needed to train the network. During training, output variables such as the air-steel interfacial area is used. The training algorithm used for training of the ANN model is backpropagation. It generates weightage for each of the nodes in the hidden layers. Once the ANN model is trained, a new set of input variables are received so that the trained model estimates output parameters.

Figure 6:
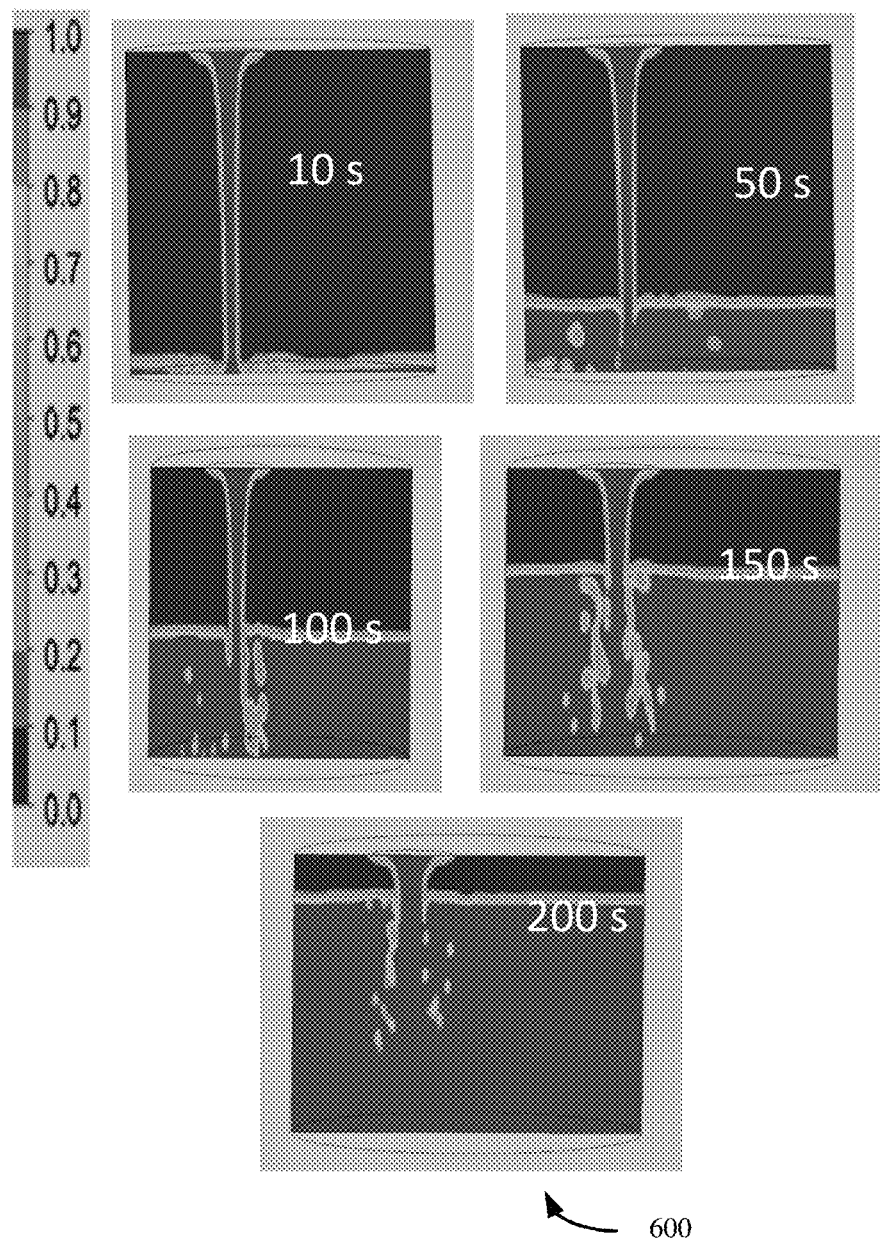
FIG. 6 is an illustration showing steel volume fraction contours for tapping operation showing the air entrapment with tapping time, in accordance with an example embodiment.
Figure 7A:
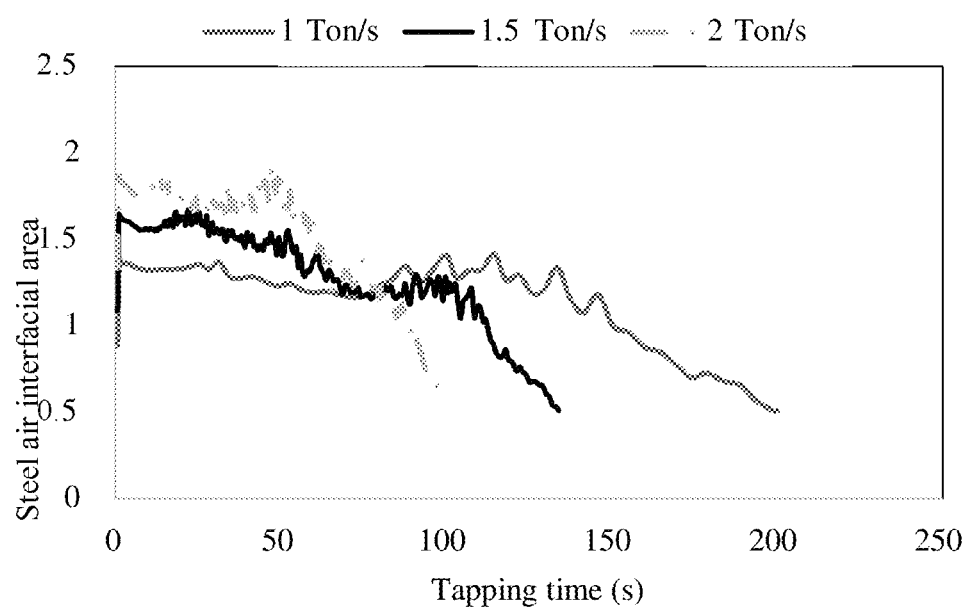
FIG. 7A illustrates a graph showing CFD results for steel-air interfacial area for different tapping rates, in accordance with an example embodiment.
Figure 7B:
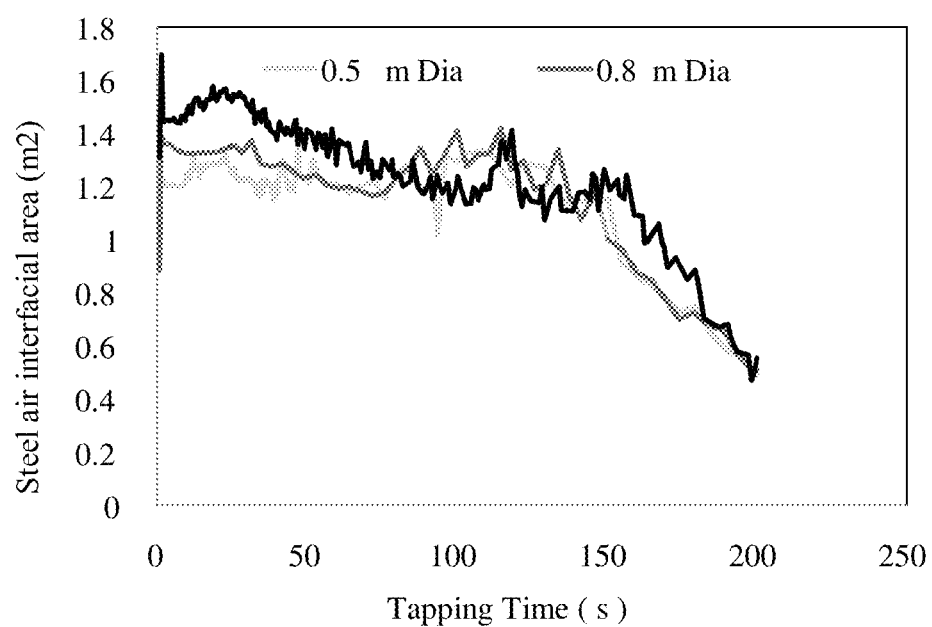
FIG. 7B illustrates a graph showing CFD results for steel-air interfacial area for different inlet diameters, in accordance with an example embodiment.
Figure 7C:
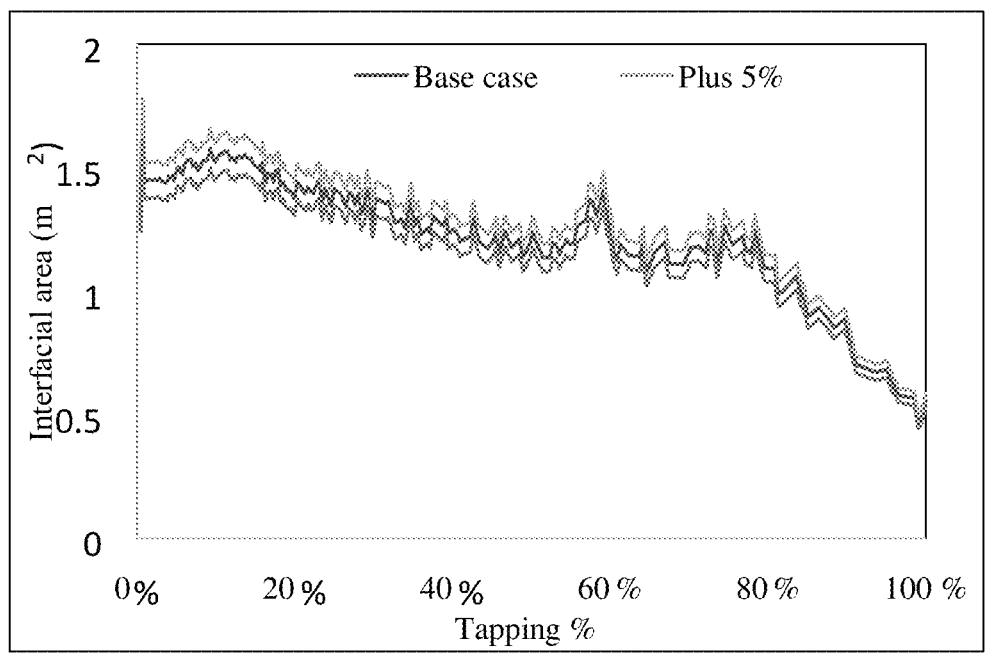
FIG. 7C illustrates a graph for influence index compared to a base case (1 ton/s rate and 1 meter inlet diameter), in accordance with an example embodiment.

An example showing steel volume fraction contours for tapping operation showing air entrapment with tapping time is shown in the diagram 600 of FIG. 6. An example graph 700A of FIG. 7A shows CFD results for steel-air interfacial area for different tapping rates. An example graph 700B of FIG. 7B shows CFD results for steel-air interfacial area for different inlet diameters. Whenever, for any of the values within the specified range of any input parameter, the value of air-steel interfacial area falls outside the ±5% compared to base case as shown in the graph 700C then the input parameter is considered as an influential parameter else the input parameters is ignored. Here in the graph 700C, black line is the base case and gray lines are the bounding lines.

In an example implementation, n-multi-layer perceptron (MLP) network is used in the modeling. The network has 5, 5 and 1 are the number of neurons (node) in each input layer, hidden layer and output layer respectively. By taking the input and output data, all the inputs and outputs are normalized individually. Each neuron has its weight and biases. Further, Back-propagation (BP) learning algorithm is used for the training of the network. The BP learning algorithm include the following steps:

1) Initialize weights and biases in the network.
2) Propagate inputs forward in the usual way, i.e.
   All outputs are computed using sigmoid threshold of the inner product of the corresponding weight and input vectors.
   All outputs at stage n are connected to all the inputs at stage n+1.
3) Error back-propagation: Propagates the errors backwards by apportioning it to each unit according to the unit influence level
4) Training termination (Convergence criteria)
   Maximum number of iteration is reached.
   Specified target error value is reached.
   All weights in the previous epoch were so small as to below some specific threshold
   The percentage of tuples misclassified in the previous epoch is below some threshold
   A pre-specified number of epochs have expired. A classifier, which gives a higher accuracy value, is considered as a good classifier.

The first step of the neural network modeling is the initialization of the network. All the weights and biases associated with neurons are given some initial value for the start of the iteration. These weights and biases are then modified as the training progresses. All the weights and biases of the network are initialized with the random values. The Second step of the neural network modeling starts with passing the training data to the input layer of the network. The inputs pass through the input units, unchanged. Next, the net input and output of each unit in the hidden and output layers are computed. The net input to a unit in the hidden or output layers is computed as a linear combination of its inputs. Net input to the unit is computed by multiplying inputs connected to the unit with its corresponding weight, and then is summed up with the biases. Given a unit in a hidden layer or output layer, the net input, $I_j$ to unit j is given in the equation 1.

$$I_j = \sum_i W_{ij} O_i + \theta_j \tag{1}$$

Where $W_{ij}$ is the weight of the connection from the unit $I_j$ in the previous layer to unit j, $O_i$, output of unit I from the previous layer $\theta_j$ is the bias of the unit. The bias acts as a threshold in that it serves to vary the activity of the unit. Each unit in the hidden and output layers takes its net input and then applies an activation function. The function symbolizes the activation of neuron represented by the unit. The logistic or sigmoid function is used and the output of unit j, is computed as the equation 2. This function is also referred to as squashing function, because it maps a large input domain onto the smaller range of 0 to 1.

$$O_j = \frac{1}{1+e^{-I_j}} \quad (2)$$

error is back propagated backward by updating the weights and biases to reflect the networks prediction. For a unit j in the output layer, the error is computed by the equation 3.

$$Err_j = O_j(1-O_j)(T_j-O_j) \quad (3)$$

Where Oj is the actual output of unit j, and $T_j$ is the known target value of the given training data set. To compute the error of a hidden layer unit j, the weighted sum of the errors of the units connected to unit j in the next layer is considered. The error of a hidden layer unit j is calculated by the equation 4.

$$Err_j = O_j(1-O_j)\sum_k Err_k w_{jk} \quad (4)$$

Where $W_{jk}$ is the weight of the connection from unit j to a unit k in the next higher layer, and $Err_k$ is the error of unit k. The weights and biases are updated to reflect the propagated errors. Weights are updated according to the weights calculated by the equation 5.

$$w_{ij} = w_{ij} + (l)Err_j O_i \quad (5)$$

The variable l is the learning rate, a constant having a value between 0 to 1. Back propagation learns using a method of gradient descent to search for a set of weights that fits the training data so as to minimize the mean squared error. The learning rate helps avoid getting stuck at a local minimum and encourages finding global minimum. Biases are updated by the equation 6.

$$\theta_j = \theta_j + (l)Err_j \quad (6)$$

In some embodiments, the estimation module 118 can be used to estimate desulfurization at air-steel interface and nitrogen, hydrogen and oxygen pickup from eye opening. For this, chemical kinetic equations are solved for each of the physical variables. The predicted parameters from the ANN model are used for predicting the nitrogen, hydrogen and sulphur concentration in the ladle. The prediction of these physical parameters are very fast and accurate. Therefore, these prediction can facilitate the online control of the process for better productivity of the steel plant as well as the quality of the steel.

Figure 8:
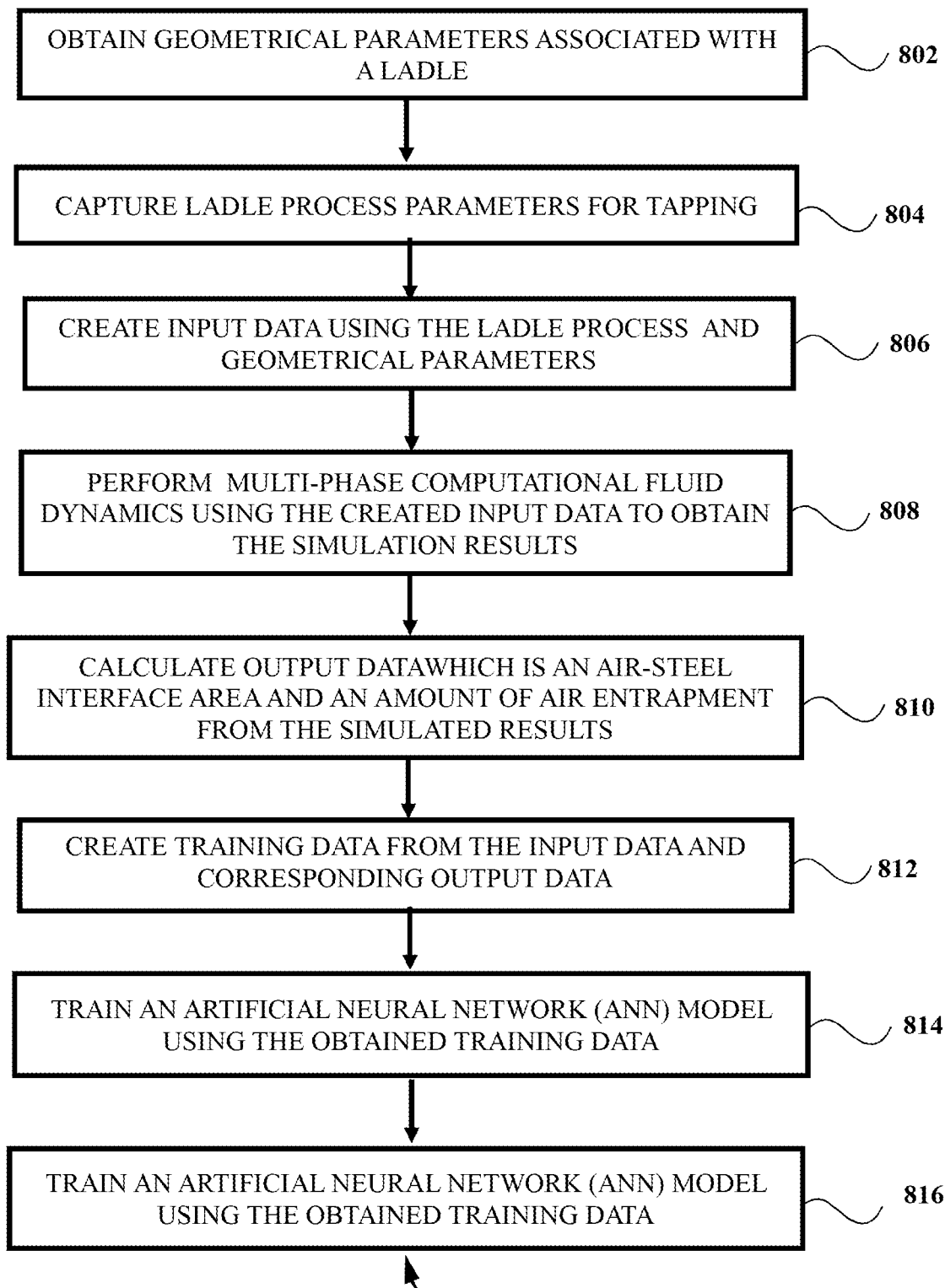
FIG. 8 illustrates a flow diagram of a method for determination of air entrapment in ladles, in accordance with an example embodiment.

FIG. 8 illustrates a flow diagram of a method 800 for determination of air entrapment in ladles, in accordance with an example embodiment. The method 800 may be described in the general context of computer executable instructions. Generally, computer executable instructions can include routines, programs, objects, components, data structures, procedures, modules, functions, etc., that perform particular functions or implement particular abstract data types. The method 800 may also be practiced in a distributed computing environment where functions are performed by remote processing devices that are linked through a communication network. The order in which the method 800 is described is not intended to be construed as a limitation, and any number of the described method blocks can be combined in any order to implement the method 800, or an alternative method. Furthermore, the method 800 can be implemented in any suitable hardware, software, firmware, or combination thereof. In an embodiment, the method 800 depicted in the flow chart may be executed by a system, for example, the system 100 of FIG. 1.

At block 802, geometrical parameters associated with a ladle are received. For example, the geometrical parameters include ladle top and bottom diameters, ladle height, a number of plugs, position of the plugs, diameters of the plugs and the like. At block 804, ladle process parameters for tapping are captured. For example, the ladle process parameters include a range of tapping rates, a tapping inlet area, an initial slag height, a percentage of carry over slag in the incoming steel, a duration of tapping and the like. At block 806, input data is created using the ladle process parameters and geometrical parameters. In an example implementation, the ladle geometrical parameters and process parameters are divided into a number of sets which captures whole range of processing conditions and geometrical details. Multi-phase computational fluid dynamics simulation is then performed for the parameter values with extreme ranges in each sets. Further, key parameters in each of the sets are identified by calculating an influence index from the CFD simulation results for each of the extreme ranges of parameters and one or more parameters with influence index greater than a predefined value are selected. Furthermore, the input data for the one or more parameters is created.

At block 808, multi-phase computational fluid dynamics is performed using the created input data to obtain the simulation results. In an example implementation, a virtual geometry of the ladle is created using the geometrical parameters. Further, a computational grid is generated using the virtual geometry of the ladle. Furthermore, boundary conditions required for modeling of the computational fluid dynamics is generated using the ladle process parameters. In addition, the multi-phase computational fluid dynamics simulations are performed using the computational grid, boundary conditions and predefined solver conditions.

At block 810, output data which is an air-steel interface area and an amount of air entrapment is calculated from the simulated results. In an embodiment, the amount of air entrapment within the steel in the ladle is calculated by estimating fluid area where liquid steel is less than a predetermined value. Further, the air-steel interfacial area is calculated by estimating a liquid steel-air interface where the air more than a predetermined value.

At block 812, training data is created from the input data and corresponding output data. At block 814, an artificial neural network (ANN) model is trained using the obtained training data. At block 816, an amount of air entrapment and an air-steel interface area in the ladle are determined for new geometrical parameters and the ladle process parameters using the trained ANN model.

The written description describes the subject matter herein to enable any person skilled in the art to make and use the embodiments. The scope of the subject matter embodiments is defined by the claims and may include other modifications that occur to those skilled in the art. Such other modifications are intended to be within the scope of the claims if they have similar elements that do not differ from the literal language of the claims or if they include equivalent elements with insubstantial differences from the literal language of the claims.

It is, however to be understood that the scope of the protection is extended to such a program and in addition to a computer-readable means having a message therein; such non-transitory computer-readable storage means contain program-code means for implementation of one or more steps of the method, when the program runs on a server or mobile device or any suitable programmable device. The hardware device can be any kind of device which can be programmed including e.g. any kind of computer like a server or a personal computer, or the like, or any combination thereof. The device may also include means which could be e.g. hardware means like e.g. an application-specific integrated circuit (ASIC), a field-programmable gate array (FPGA), or a combination of hardware and software means, e.g. an ASIC and an FPGA, or at least one microprocessor and at least one memory with software modules located therein. Thus, the means can include both hardware means and software means. The method embodiments described herein could be implemented in hardware and software. The device may also include software means. Alternatively, the embodiments may be implemented on different hardware devices, e.g. using a plurality of CPUs.

The embodiments herein can comprise hardware and software elements. The embodiments that are implemented in software include but are not limited to, firmware, resident software, microcode, etc. The functions performed by various modules described herein may be implemented in other modules or combinations of other modules. For the purposes of this description, a computer-usable or computer readable medium can be any apparatus that can comprise, store, communicate, propagate, or transport the program for use by or in connection with the instruction execution system, apparatus, or device.

The foregoing description of the specific implementations and embodiments will so fully reveal the general nature of the implementations and embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the embodiments as described herein.

The preceding description has been presented with reference to various embodiments. Persons having ordinary skill in the art and technology to which this application pertains will appreciate that alterations and changes in the described structures and methods of operation can be practiced without meaningfully departing from the principle, spirit and scope.

What is claimed is:

1. A processor-implemented method comprising:
   obtaining geometrical parameters associated with a ladle, wherein the geometrical parameters comprise ladle top and bottom diameters, ladle height, a number of plugs, position of the plugs, and diameters of the plugs;
   capturing ladle process parameters for tapping, wherein the ladle process parameters comprise a range of tapping rates, a tapping inlet area, an initial slag height, a percentage of carry over slag in incoming steel and a duration of tapping;
   creating input data using the ladle process parameters and the geometrical parameters;
   performing multi-phase computational fluid dynamics (CFD) using the created input data to obtain simulation results;
   calculating output data which is an air-steel interface area and an amount of air entrapment from the simulated results;
   creating training data from the input data and corresponding output data;
   training an artificial neural network (ANN) model using the obtained training data; and
   determining an amount of air entrapment and an air-steel interface area in the ladle using the trained ANN model.

2. The method of claim 1, wherein creating input data using the ladle process parameters and the geometrical parameters, comprises:
   dividing the geometrical parameters and the ladle process parameters into a number of sets which captures whole range of processing conditions and geometrical details;
   performing multi-phase computational fluid dynamics simulation for the parameter values with ranges in each sets;
   identifying key parameters in each of the sets by calculating an influence index from CFD simulation results for each of the ranges of parameters and selecting one or more of the parameters with influence index greater than a predefined value; and
   creating the input data for the key parameters.

3. The method of claim 2, wherein performing the multi-phase computational fluid dynamics, comprises:
   creating a virtual geometry of the ladle using the geometrical parameters;
   generating a computational grid using the virtual geometry of the ladle;
   generating boundary conditions required for modeling of the computational fluid dynamics using the ladle process parameters; and
   performing the multi-phase computational fluid dynamics simulations using the computational grid, boundary conditions and predefined solver conditions.

4. The method of claim 1, wherein calculating output data which is the air-steel interface area and the amount of air entrapment from the simulated results, comprises:
   calculating the amount of air entrapment within the steel in the ladle by estimating fluid area where liquid steel is less than a predetermined value; and
   calculating the air-steel interfacial area by estimating an liquid steel-air interface where the percentage of air is more than a predetermined value.

5. A system comprising:
   one or more memories; and
   one or more hardware processors, the one or more memories coupled to the one or more hardware processors, wherein the one or more hardware processors are configured to execute programmed instructions stored in the one or more memories to:
      obtain geometrical parameters associated with a ladle, wherein the geometrical parameters comprise ladle top and bottom diameters, ladle height, a number of plugs, position of the plugs, and diameters of the plugs;
      capture ladle process parameters for tapping, wherein the ladle process parameters comprise a range of tapping rates, a tapping inlet area, an initial slag height and a duration of tapping;

create input data using the ladle process parameters and the geometrical parameters;

perform multi-phase computational fluid dynamics using the created input data to obtain simulation results;

calculate output data which is an air-steel interface area and an amount of air entrapment from the simulated results;

create training data from the input data and corresponding output data;

train an artificial neural network (ANN) model using the obtained training data; and determine an amount of air entrapment and an air-steel interface area in the ladle using the trained ANN model.

6. The system of claim 5, wherein the one or more hardware processors are further capable of executing programmed instructions to:

divide the geometrical parameters and the ladle process parameters into a number of sets which captures whole range of processing conditions and geometrical details;

perform multi-phase computational fluid dynamics simulation for the parameter values with extreme ranges in each sets;

identify key parameters in each of the sets by calculating an influence index from CFD simulation results for each of the extreme ranges of parameters and selecting the parameters with influence index greater than the predefined value;

create the input data for the key parameters.

7. The system of claim 6, wherein the one or more hardware processors are further capable of executing programmed instructions to:

create a virtual geometry of the ladle using the geometrical parameters;

generate a computational grid using the virtual geometry of the ladle;

generate boundary conditions required for modeling of the computational fluid dynamics using the ladle process parameters; and perform the multi-phase computational fluid dynamics simulations using the computational grid, boundary conditions and predefined solver conditions.

8. The system of claim 6, wherein the one or more hardware processors are further capable of executing programmed instructions to:

calculate the amount of air entrapment within the steel in the ladle by estimating fluid area where liquid steel is less than a predetermined value; and calculate the air-steel interfacial area by estimating an liquid steel-air interface where a percentage of air is more than a predetermined value.

9. One or more non-transitory machine readable information storage mediums comprising one or more instructions which when executed by one or more hardware processors causes the one or more hardware processor to perform a method for determination of air entrapment in ladles, said method comprising:

obtaining geometrical parameters associated with a ladle, wherein the geometrical parameters comprise ladle top and bottom diameters, ladle height, a number of plugs, position of the plugs, and diameters of the plugs;

capturing ladle process parameters for tapping, wherein the ladle process parameters comprise a range of tapping rates, a tapping inlet area, an initial slag height, a percentage of carry over slag in incoming steel and a duration of tapping;

creating input data using the ladle process parameters and the geometrical parameters;

performing multi-phase computational fluid dynamics (CFD) using the created input data to obtain simulation results;

calculating output data which is an air-steel interface area and an amount of air entrapment from the simulated results;

creating training data from the input data and corresponding output data;

training an artificial neural network (ANN) model using the obtained training data; and determining an amount of air entrapment and an air-steel interface area in the ladle using the trained ANN model.

10. The one or more non-transitory machine readable information storage mediums of claim 9, further comprising:

dividing the geometrical parameters and the ladle process parameters into a number of sets which captures whole range of processing conditions and geometrical details;

performing multi-phase computational fluid dynamics simulation for the parameter values with ranges in each sets;

identifying key parameters in each of the sets by calculating an influence index from CFD simulation results for each of the ranges of parameters and selecting one or more of the parameters with influence index greater than a predefined value; and creating the input data for the key parameters.

11. The one or more non-transitory machine readable information storage mediums of claim 10, further comprising:

creating a virtual geometry of the ladle using the geometrical parameters;

generating a computational grid using the virtual geometry of the ladle;

generating boundary conditions required for modeling of the computational fluid dynamics using the ladle process parameters; and performing the multi-phase computational fluid dynamics simulations using the computational grid, boundary conditions and predefined solver conditions.

12. The one or more non-transitory machine readable information storage mediums of claim 9, further comprising:

calculating the amount of air entrapment within the steel in the ladle by estimating fluid area where liquid steel is less than a predetermined value; and calculating the air-steel interfacial area by estimating an liquid steel-air interface where the percentage of air is more than a predetermined value.

* * * * *